(12) United States Patent
Fredriksson

(10) Patent No.: US 7,088,188 B2
(45) Date of Patent: Aug. 8, 2006

(54) DIFFERENTIAL OSCILLATOR

(75) Inventor: Jesper Fredriksson, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 143 days.

(21) Appl. No.: 10/467,392

(22) PCT Filed: Feb. 13, 2001

(86) PCT No.: PCT/SE01/00283

§ 371 (c)(1),
(2), (4) Date: Dec. 22, 2003

(87) PCT Pub. No.: WO02/065632

PCT Pub. Date: Aug. 22, 2002

(65) Prior Publication Data
US 2004/0113707 A1 Jun. 17, 2004

(51) Int. Cl.
H03B 5/00 (2006.01)
H03B 5/12 (2006.01)
H03B 5/36 (2006.01)

(52) U.S. Cl. .................... 331/46; 331/57; 331/116 R; 331/116 FE; 331/117 R; 331/117 FE; 331/177 R; 331/177 V

(58) Field of Classification Search .............. 331/36 C, 331/46, 57, 96, 108 B, 116 R, 116 FE, 117 R, 331/117 FE, 117 D, 135–136, 172, 177 R, 331/177 V
See application file for complete search history.

(56) References Cited

U.S. PATENT DOCUMENTS 3,361,991 A * 1/1968 Wyndrum, Jr. ............. 331/110
5,859,572 A   1/1999 Hill
6,249,190 B1 * 6/2001 Rozenblit et al. ............. 331/46

FOREIGN PATENT DOCUMENTS

EP     0261714 A1   4/1987
EP     0457348 A2   5/1991

* cited by examiner

Primary Examiner—David Mis

(57) ABSTRACT

The invention relates to a new family of differential oscillators based on oscillator amplifiers with local feedback forming respective local feedback systems, and at least one common link interconnecting the local feedback systems. Each branch of the differential oscillator includes an oscillator amplifier with a phase shifting and impedance transforming local feedback path from the output to the input of the amplifier to form a local feedback system. The differential oscillator also includes one or more common phase shifting links for interconnecting and cooperating with the local feedback systems to enable self-sustained differential oscillation. In differential mode operation, the electrical midpoint of the common phase shifting link(s) is virtually grounded and the local feedback systems of the two branches operate, together with the common phase shifting link(s), effectively in anti-phase with respect to each other as two separate oscillators.

19 Claims, 12 Drawing Sheets

DIFFERENTIAL OSCILLATOR

TECHNICAL FIELD OF THE INVENTION

The present invention generally relates to the field of oscillator design, and more specifically to differential oscillators.

BACKGROUND OF THE INVENTION

Oscillators can be found in numerous fields of technology, and are widely used for example in computers, telecommunication equipment and other electronic systems. With the ever-increasing demand for faster and more effective electronic systems comes the need for more and more sophisticated oscillators. In particular, the ever-increasing data processing and transmission rates in modern electronic systems reduce the timing margins between correlated signals and events. In this respect, a major source of uncertainty is the cycle-to-cycle variation (commonly denoted as jitter) in the various clock signals that are used as tiling references in such a system. Therefore, clock oscillators of high stability and low phase noise are of outmost importance in synchronous high-speed electronic systems.

Single-sided (non-differential) resonator based clock oscillators often suffer from poor noise rejection, which in turn reduces the phase stability and increases the oscillation period variations. In this respect, noise is used to reference various phase stability degrading disturbances such as internally generated noise in the active and passive components as well as noise from external interference sources.

A strong emerging trend in many fields of electronics is to introduce a differential scheme in order to suppress noise. With a differential scheme, any element in an electronic system that has to suppress noise is split into two branches. One of the branches contains the normal information, whereas the other branch contains the complementary (inverted) information. With proper matching of components, a highly symmetric design between the two branches can usually be obtained. Since, the useful information is recovered or extracted from the difference in state between the two branches, all common mode disturbances that affect both branches equally are ideally balanced out completely.

Differential output stages used in many conventional oscillators provide balanced transmission properties with good noise immunity. However, it is only when the entire oscillator is symmetric with differential clock generation that the noise suppression capabilities of the differential scheme are utilized effectively.

A common differential topology is the cross-coupled Colpitt oscillator with cross-coupled feedback between the oscillator amplifiers, for example as shown in the textbook. *RF Microelectronics* by B. Razavi, Prentice Hall, pp. 228. However, although the clock generation of the Colpitt oscillator is differential, the Colpitt oscillator suffer from relatively high resonator loading and low external load isolation with degraded Q-value and reduced phase stability as a result.

U.S. Pat. No. 4,565,978 discloses an integrable bipolar oscillator circuit based on two transistor-based amplifiers with their emitters connected to a constant current source and their collectors connected to respective load resistors. Two emitter followers control the base terminals of the amplifiers and increase the input impedance to reduce the damping of the frequency-determining resonant LC-network that is connected between the bases of the emitter followers. In-phase feedback to the amplifier inputs is accomplished by means of cross-coupled feedback resistors.

U.S. Pat. No. 4,810,976 discloses a frequency doubling oscillator and mixer circuit in which a resonant impedance network, in the form of a capacitor and a center-tapped inductor, is connected across the bases of two matched transistors. Each transistor is connected to a current source via its emitter. A capacitor is also connected between the two emitter terminals of the transistors. In operation, the capacitor appears as a negative impedance shunt across the resonant network. The collectors are connected to a summing node, from which the output is extracted. The fundamental resonant frequency signals at the collectors are of opposite phase and since the oscillator is balanced, these signals cancel out at the summing node, while signals at the second harmonic are maintained in-phase and add at the summing node. The result is a net frequency doubling.

U.S. Pat. No. 5,680,077 discloses an oscillator-transmitter with shared output circuit and an input tank circuit coupled between two common-emitter amplifiers configured in an oscillator arrangement. The output circuit is coupled between the collectors of the amplifiers and radiates energy provided by both amplifiers. The oscillator-transmitter circuit is completed by means of cross-coupled feedback capacitors.

U.S. Pat. No. 6,154,102 discloses a controllable LC oscillator circuit, which has a resonant circuit including an inductance and a capacitance disposed in parallel. The oscillator is driven by an amplifier and the inductance is produced using coupled coils.

The international patent publication WO 00/31869 discloses a cross-coupled controllable oscillator.

SUMMARY OF THE INVENTION

The present invention overcomes these and other drawbacks of the prior art arrangements.

It is a general object of the invention to provide a high quality differential oscillator with excellent oscillation properties.

It is also an object of the invention to provide a highly symmetric oscillator with near-ideal differential operation and improved phase stability.

Yet another object of the invention is to design a differential oscillator without the use of inductors or similar low quality components.

A particular object of the invention is to provide a differential oscillator that is capable of operating in high performance, high speed digital electronic systems and communication links with tight timing requirements and/or harsh spectral purity requirements.

These and other objects are met by the invention as defined by the accompanying patent claims.

The present invention introduces a new family of differential oscillators based on oscillator amplifiers with local feedback forming respective local feedback systems, and at least one common link interconnecting the local feedback systems. Each branch of the differential oscillator includes an oscillator amplifier with a phase shifting and impedance transforming local feedback path from the output to the input of the amplifier to form a local feedback system. The differential oscillator further comprises at least one common phase shifting link for interconnecting and cooperating with the local feedback systems to enable self-sustained differential oscillation. In particular, it can be noted that the common phase shifting link(s) interconnects the local feedback systems without introducing any additional feedback.

In differential mode operation, the electrical midpoint of the common phase shifting link(s) is virtually grounded and the local feedback systems of the two branches operate, together with the common phase shifting link(s), effectively in anti-phase with respect to each other as two separate oscillators.

The new oscillator architecture proposed by the invention opens up for efficient use of low-impedance buffer amplifiers in the differential oscillator, thus overcoming many of the deficiencies of conventional high-impedance cross-coupled feedback solutions.

In a first group of realizations, the common link and the local feedback paths are all passive and reactive to provide resonator-based differential oscillation. In order to ensure proper differential oscillation, the local feedback paths are capacitive when the common link is inductive, or the other way around, the local feedback paths are inductive when the common link is capacitive.

In another group of realizations, the phase shifting and impedance transforming local feedback paths are implemented by active circuitry. Preferably, each local feedback path includes a feedback amplifier and a phase shift circuit to provide the necessary phase shift and impedance transformation. By realizing the local feedback paths using appropriately configured active circuitry, the need for passive inductive low-quality components can be eliminated. This approach is particularly suitable for Integrated Circuit (IC) design and implementation, and generally results in a high quality differential oscillator with excellent phase stability. An elegant realization involves an inverting feedback amplifier with an embedded phase shift filter in each of the local feedback paths, together with a capacitive common link interconnecting the oscillator amplifiers.

Furthermore, by introducing a properly configured internal feedback loop around the active element in the feedback amplifier, higher-order phase shift filtering can be achieved without using inductive elements as in conventional higher-order LC filters. This is a great advantage, since a high Q-value can be obtained without being limited, by the internal losses of the inductive elements.

In addition, the local feedback paths may be realized by multiple cascaded feedback amplifier and phase shift filter combinations or blocks to increase the design flexibility and to relax the gain and phase shift requirements on each phase shifting block. In this respect, it its advisable to use several common phase shifting links, each of which is interconnected between corresponding terminals in the local feedback paths, to improve the differentiality even further.

The invention offers the following advantages:

Excellent oscillation properties;

Self-sustained differential oscillation—native differential operation with high common mode rejection;

High phase stability and quality value (Q);

Low-impedance buffer implementations;

Improved and scalable frequency selectivity;

High degree of insensitivity to transistor parameter variations when operated well below the cut-off frequency of the transistors;

Negative feedback stabilization at low frequencies to prevent spurious oscillation; and Tolerance to load variations.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Figure 1:
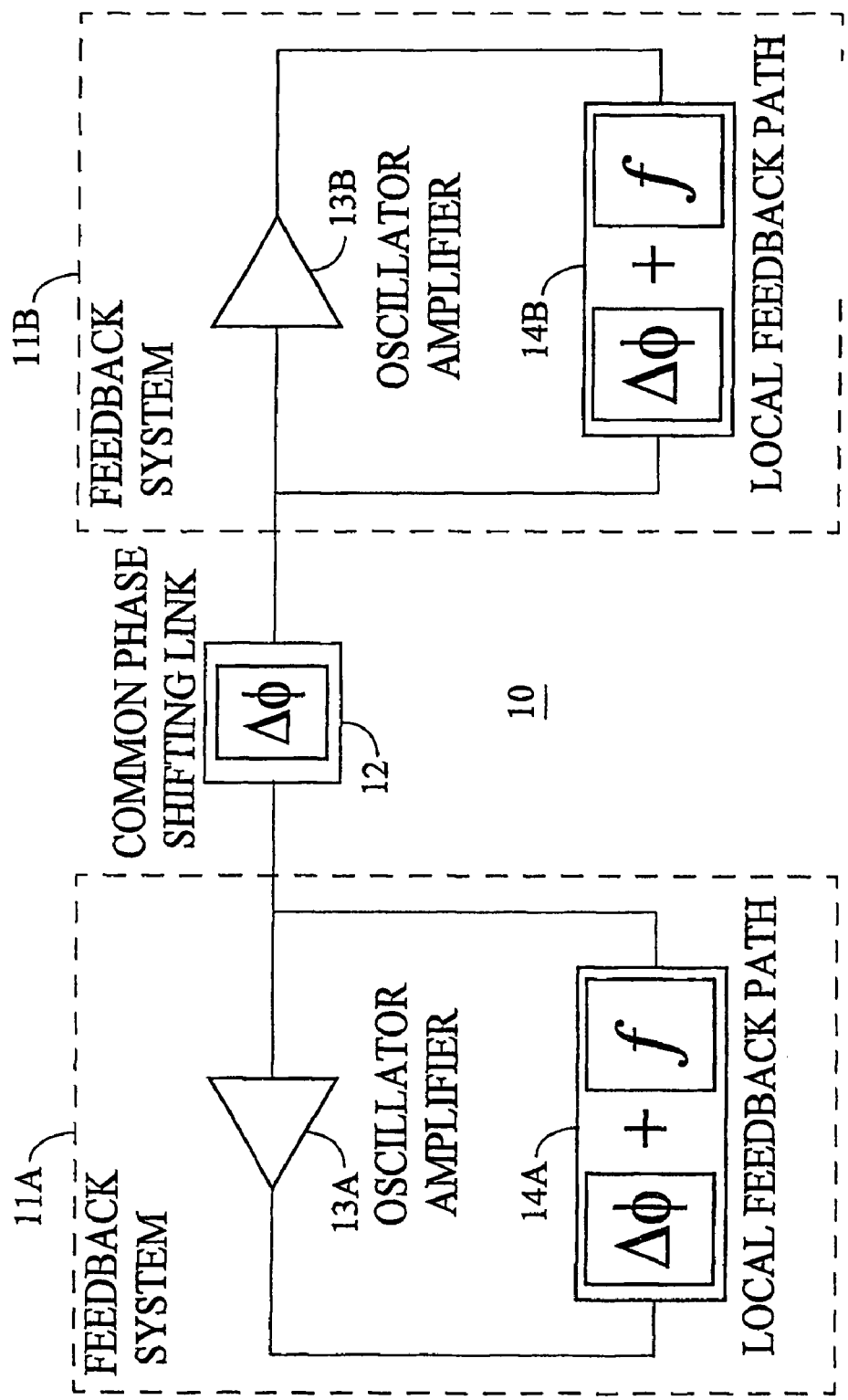
FIG. 1 is a conceptual high-level block diagram of the basic oscillator structure according to the invention.

It is useful to begin with a general introduction to the new oscillator architecture proposed by the present invention, referring to FIG. 1.

FIG. 1 is a conceptual high-level block diagram of the basic oscillator structure according to the invention. Basically the differential oscillator 10 comprises two oscillator feedback systems 11A, 11B interconnected by one or more common phase shifting links 12. Each of the oscillator feedback systems 11A/11B comprises an oscillator amplifier 13A/13B with a local feedback path 14A/14B from the output to the input of the amplifier. The feedback path is local in the sense that it runs from the output to the input of the same amplifier. Each feedback path 14A/14B includes circuitry for effectuating a phase shift ($\Delta\phi$) and an impedance transformation ($f$). In operation, the common phase shifting link(s) 12 cooperates with the two feedback systems 11A, 11B to enable self-sustained differential oscillation.

The interconnecting phase shifting link 12 completes the differential oscillator essentially formed by the two local oscillator feedback systems. The two ideally identical feedback systems 11A and 11B operate, together with the common phase shifting link 12, effectively in anti-phase with respect to each other as two separate oscillator halves joined by a common connection.

It is clear that the two local feedback paths should be configured in such a manner that each local feedback path has a significant phase shift when they are isolated from each other. However, self-sustained oscillation in each local feedback system requires in-phase feedback, which is clearly not present when the local feedback systems are separated. Therefore, a common phase shifting link(s) is arranged for interconnecting the two feedback systems. However, it is important that the common link is arranged in such a way that the required zero phase shift condition is met only when the two local feedback systems operate in antiphase with respect to each other, i.e. for differential excitation. When the two local feedback systems operate in phase with respect to each other, the common phase shifting link is effectively absent since there is no potential difference between the two sides and hence no current flow through the common link. In the latter case, the two local feedback systems can be considered as effectively separated from each other, with no influence from the common phase shifting link, and thus no in-phase feedback is possible. In this way, differential oscillation is strongly favored. Preferably, the local feedback paths are preferably arranged in such a manner that they experience an abrupt change in phase shift when the frequency deviates slightly from the desired oscillation frequency, thereby reducing the phase noise in the output signals.

For a better understanding of the invention, the proposed oscillator architecture will now be described in detail with reference to a first embodiment of the invention, as outlined in FIG. 2.

Figure 2:
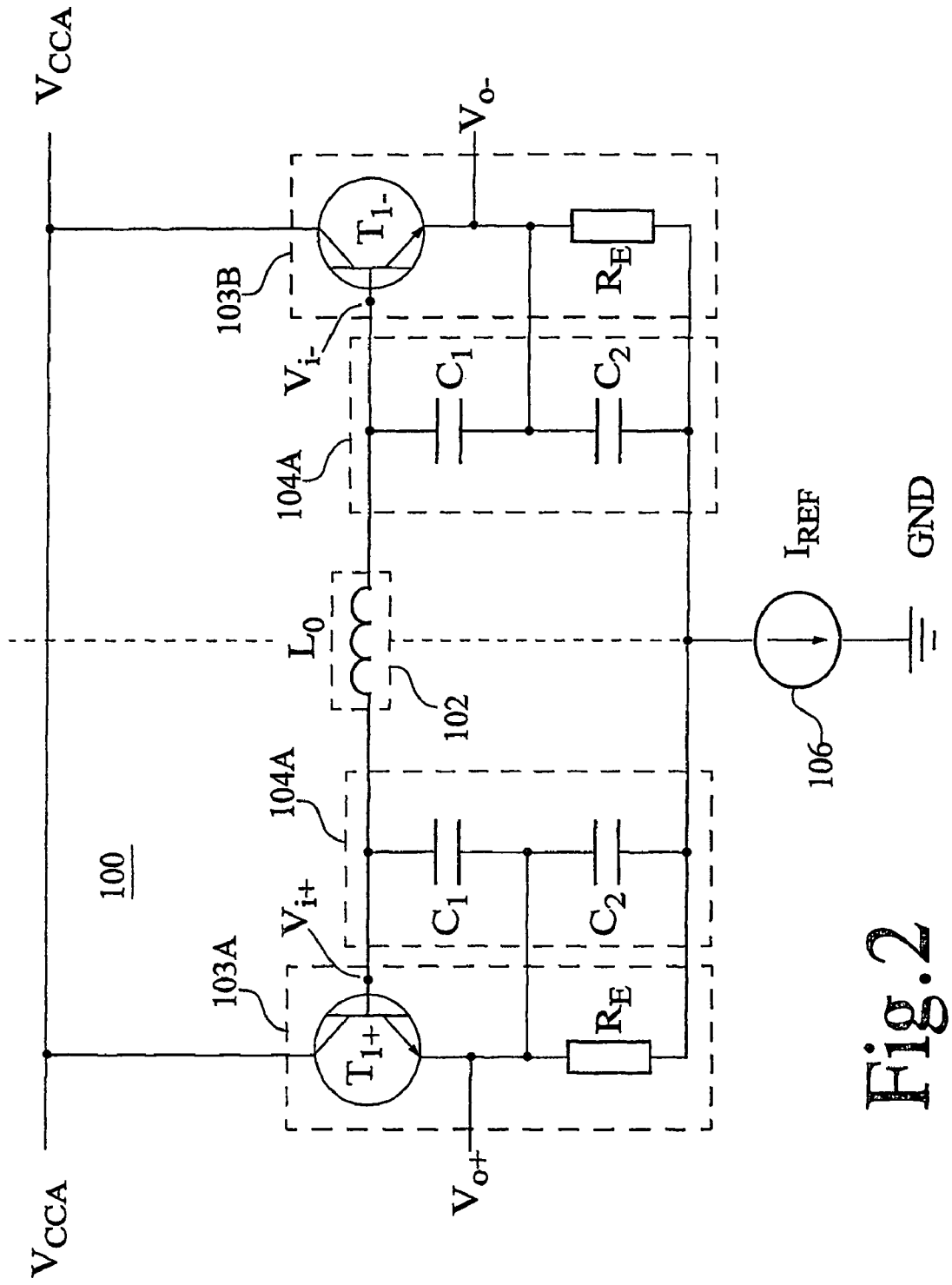
FIG. 2 is a circuit diagram of a resonator-based differential oscillator, excluding tuning and bias circuitry, according to a first embodiment of the invention.

FIG. 2 is a schematic circuit diagram of a resonator-based differential oscillator, excluding tuning and bias circuitry, according to a first embodiment of the invention. The differential oscillator 100 basically comprises two branches interconnected by a common inductive element $L_0$. Each branch includes an oscillator amplifier 103A/103B with a capacitive local feedback path 104A/104B. In this particular is example, each of the oscillator amplifiers 103A/103B is preferably realized as a low-impedance buffer amplifier such as a transistor-based emitter follower. An emitter follower is basically a bipolar transistor $T_{1+}/T_{1-}$ in appropriate configuration with a resistance $R_E$. It normally has a voltage gain that is slightly less than unity, a large current gain, large input impedance and small output impedance. This means that there is practically no voltage gain from base input to emitter output, but instead the base current is amplified. By using low-impedance buffer amplifiers in the differential oscillator, many of the deficiencies (high resonator loading and low external load isolation) of conventional high-impedance cross-coupled feedback solutions are eliminated. The capacitive local feedback paths 104A and 104B are configured as capacitive voltage transformers $C_1$, $C_2$ providing the necessary phase shift and voltage/impedance transformation. Here, the overall resonant circuit of the differential oscillator 100 is defined by the capacitive local feedback paths 104A and 104B together with the common inductive element $L_0$. The differential oscillator is provided with inputs for supply voltage $V_{CCA}$, and the output signals $V_{o+}$ and $V_{o-}$ of the oscillator are extracted at the outputs of the oscillator amplifiers 103A and 103B. Proper matching of active and passive components between both sides yields a highly symmetric design.

Figure 3A:
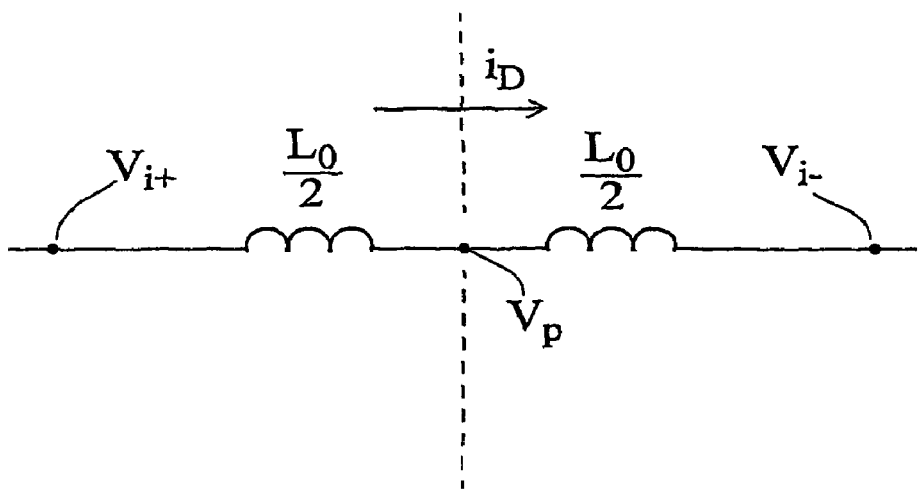
FIG. 3A illustrates an equivalent bisected model of the common inductive element of FIG. 2.

The differential operation of the new oscillator is best understood by applying the well-known bisection theorem, as described for example in *Analog Electronic Circuits Analysis & Applications* by R. B. Northorp, Addison-Wesley, pp. 65–71, to the ideally symmetric oscillator. In particular, an equivalent bisected model of the common inductive element of FIG. 2 will now be considered with reference to FIG. 3A. In the equivalent model, the common inductive element $L_0$ is split into two midpoint-grounded ($V_p$) equal halves along the axis of symmetry. Now, the common impedance can be regarded as a serial combination of two identical inductors, each having an inductance $$\frac{L_0}{2}.$$

Figure 3B:
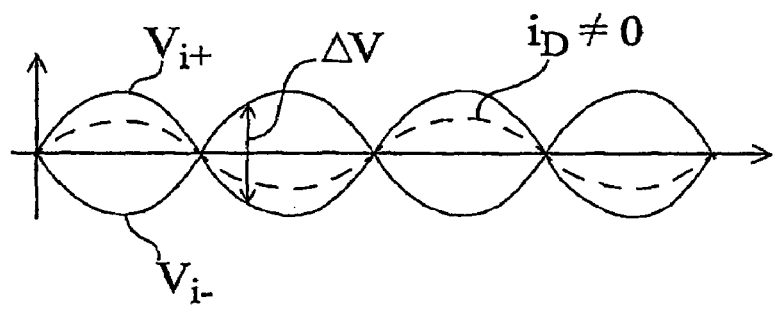
FIG. 3B is a schematic representation of the AC voltages and the differential current associated with the inductive link in differential mode.

In differential mode, the electrical midpoint $V_p$ of the bisected inductive link is virtually grounded (AC) due to the symmetry, and the two branches are working in antiphase ever shifting like a seesaw. As can be seen in FIG. 3B, the AC voltages $V_{i+}$ and $V_{i-}$ are in antiphase with each other during differential mode excitation of the resonant circuit. This results in a time-varying differential voltage $\Delta V$ over the inductive link, and a corresponding differential current $i_D$. Effectively, an electrical equivalent model of the whole differential oscillator can be seen as two ideally identical oscillator halves operating independently in antiphase with respect to each other. In this way, signal components with frequencies other than the ideal resonance frequency are strongly attenuated and filtered out by the resonance filter.

Figure 3C:
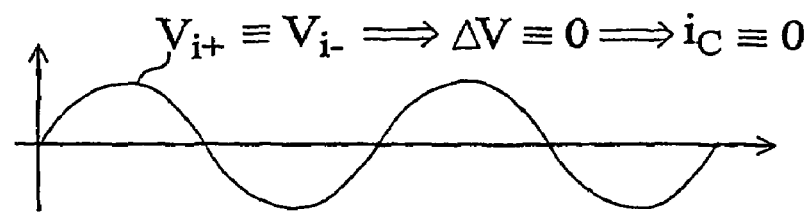
FIG. 3C is a schematic representation of the AC voltages and the common mode current associated with the inductive link in common mode.

However, during common mode excitation, the AC voltages $V_{i+}$ and $V_{i-}$ are identical to each other in phase as well as in magnitude as can be seen in FIG. 3C. This means that the voltage over the inductive link and the corresponding common mode current $i_C$ are zero at all times. Accordingly, the inductive link between the inputs of the oscillator amplifiers is electrically absent in the equivalent model and thus, ideally, there is no common mode oscillation. Only parasitic coupling and other disturbances arising from the actual physical implementation may introduce spurious modes.

In order to enhance the differential operation, a constant current source 106 may optionally be incorporated in the differential oscillator 100 as a common emitter load.

It should though be understood that by using the oscillator architecture of the invention, the introduction of a constant current source is not necessary to ensure differential operation. If no current source is utilized, the emitters are simply grounded separately.

The common phase shifting link complete the resonant circuit in such a manner that if the local feedback paths are capacitive, the common link is inductive, and vice versa so that the common link is capacitive for local inductive feedback paths. This means that it is possible to modify the resonant circuit defined by the local feedback paths and the common link by appropriately interchanging and/or combining inductive and capacitive elements as long as Barkhaussen's criteria of unity loop gain and zero total phase shift are fulfilled.

It should be understood that the apparent resonance frequency derived by analyzing only the resonant circuit itself will normally differ from the actual resonance frequency of the overall circuit due to the influence of the transistor-based amplifiers in driving the resonant circuit. Therefore, the influence of the amplifiers must be taken into consideration in dimensioning the differential oscillator circuit.

Figure 4:
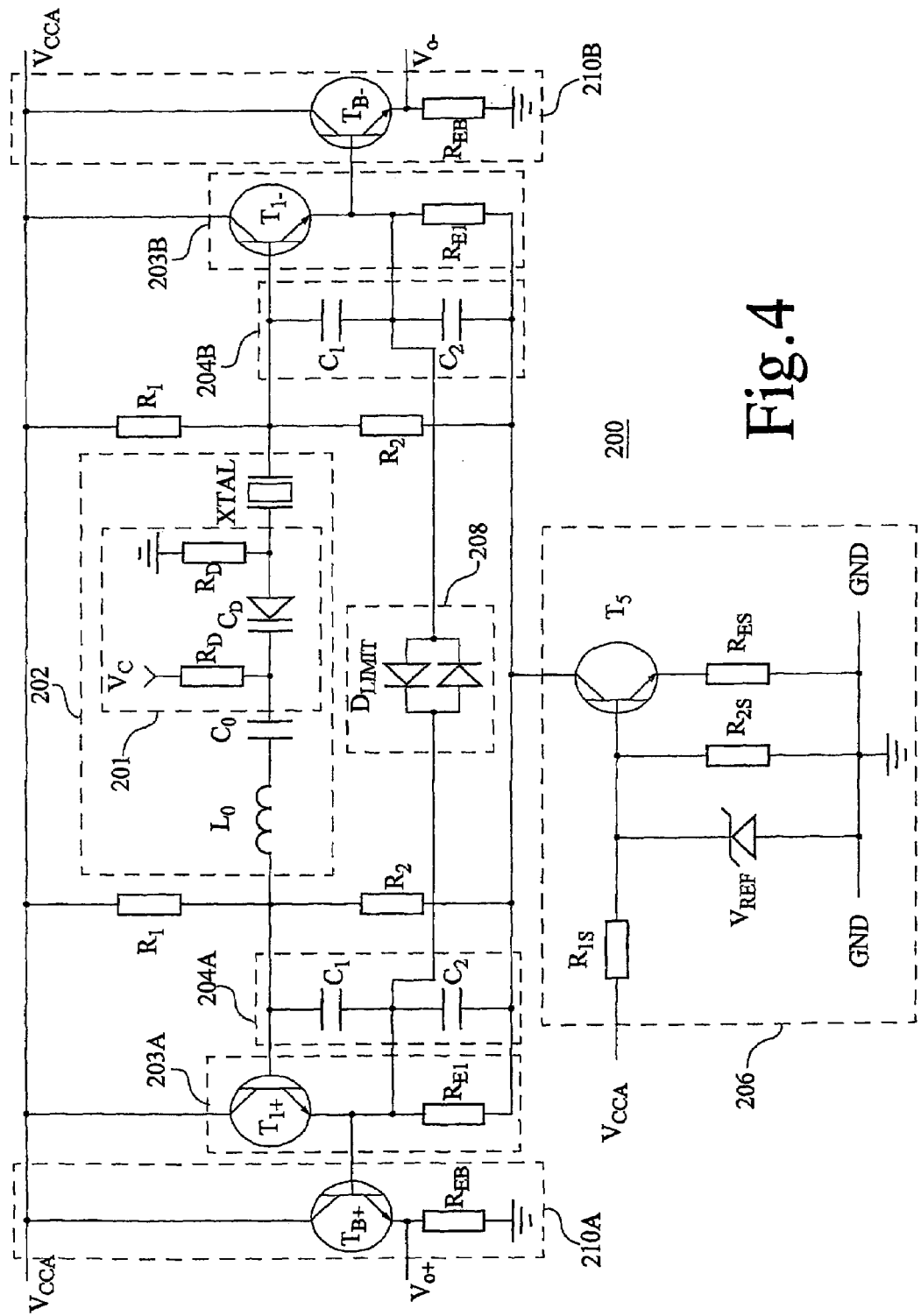
FIG. 4 is a circuit diagram of a more elaborated differential oscillator according to a second embodiment of the invention.

FIG. 4 is a schematic circuit diagram of a more elaborated differential oscillator according to a second embodiment of the invention. In similarity to the differential oscillator of FIG. 2, each branch of the oscillator 200 includes an emitter follower buffer amplifier 203A/203B with a capacitive local feedback path 204A/204B. However, the differential oscillator shown in FIG. 4 also includes additional circuitry for various functions such as tuning and bias, amplifier gain limitation, crystal or SAW resonator enhancement as well as a voltage-reference-stabilized current source and first-level output buffers.

Instead of a single inductive element in the common connection link between the inputs of the emitter-follower based amplifiers 203A and 203B, the common link 202 now includes a crystal XTAL connected in series with the inductive element $L_0$. It is also possible to use a surface acoustic wave (SAW) device for resonator enhancement instead of or in combination with the crystal. In this example, a varactor based tuning circuit 201 is also incorporated in the common connection link 202. The introduction of the varactor-based tuning circuit 201 typically requires a series-connected capacitor $C_1$ for DC-separating the varactor circuit 201 from the oscillator amplifier 203A. This capacitance $C_1$ is dimensioned in such a way that it does not form part of the resonant circuit. On the other side, the crystal XTAL acts as a DC-separator for the oscillator amplifier 203B.

Bias resistors $R_1$ and $R_2$ are arranged in each branch of the oscillator for biasing the DC point of the respective emitter-follower arrangement 203A/203B. An optional voltage-reference-stabilized current source 206 may also be included in the oscillator as a common emitter load. An elegant way of introducing gain control limitation is to use an amplitude limitation circuitry 208 formed by attaching two diodes facing opposite directions between the emitter outputs. The two cross-coupled diodes of the limitation circuitry 208 provide a simple mechanism for amplifier gain limitation, as opposed to self-limitation. The oscillator of FIG. 4 is also illustrated with first level output buffers 210A and 210B that isolate the resonator from the load, thereby avoiding an undesirable reduction of the resonator Q-value.

In the embodiments described above, the common link and the local feedback paths are all reactive to provide resonator-based differential oscillation. However, according to the currently most preferred implementations of the invention, the phase shifting and impedance transforming local feedback paths are implemented by active circuitry.

Figure 5:
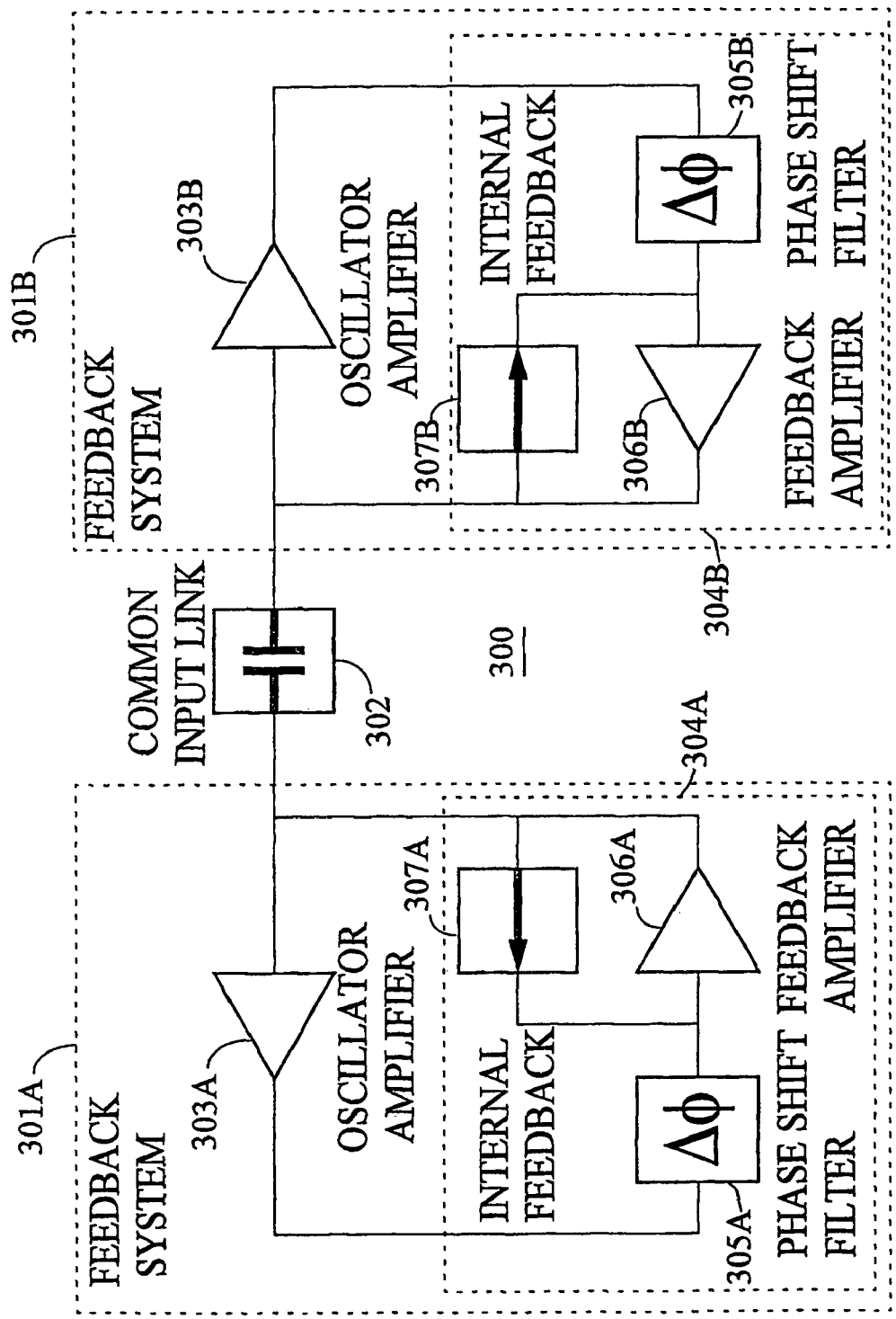
FIG. 5 is a conceptual high-level block diagram illustrating an example of a differential oscillator having local feedback paths implemented by active circuitry.

FIG. 5 is a conceptual high-level block diagram illustrating an example of a differential oscillator having local feedback paths implemented by active circuitry. Basically the differential oscillator 300 comprises two oscillator feedback systems 301A, 301B interconnected by a common capacitive link 302. Each feedback system comprises an oscillator amplifier 303A/303B with a local feedback 304A/304B from the output to the input of the amplifier. In this embodiment, each local feedback path includes a phase shift filter 305A/305B3 and a feedback amplifier 306A/306B. In practical realizations, the phase shift filter is advantageously integrated in the feedback amplifier, as will be described below with reference to FIG. 7.

Figure 6:
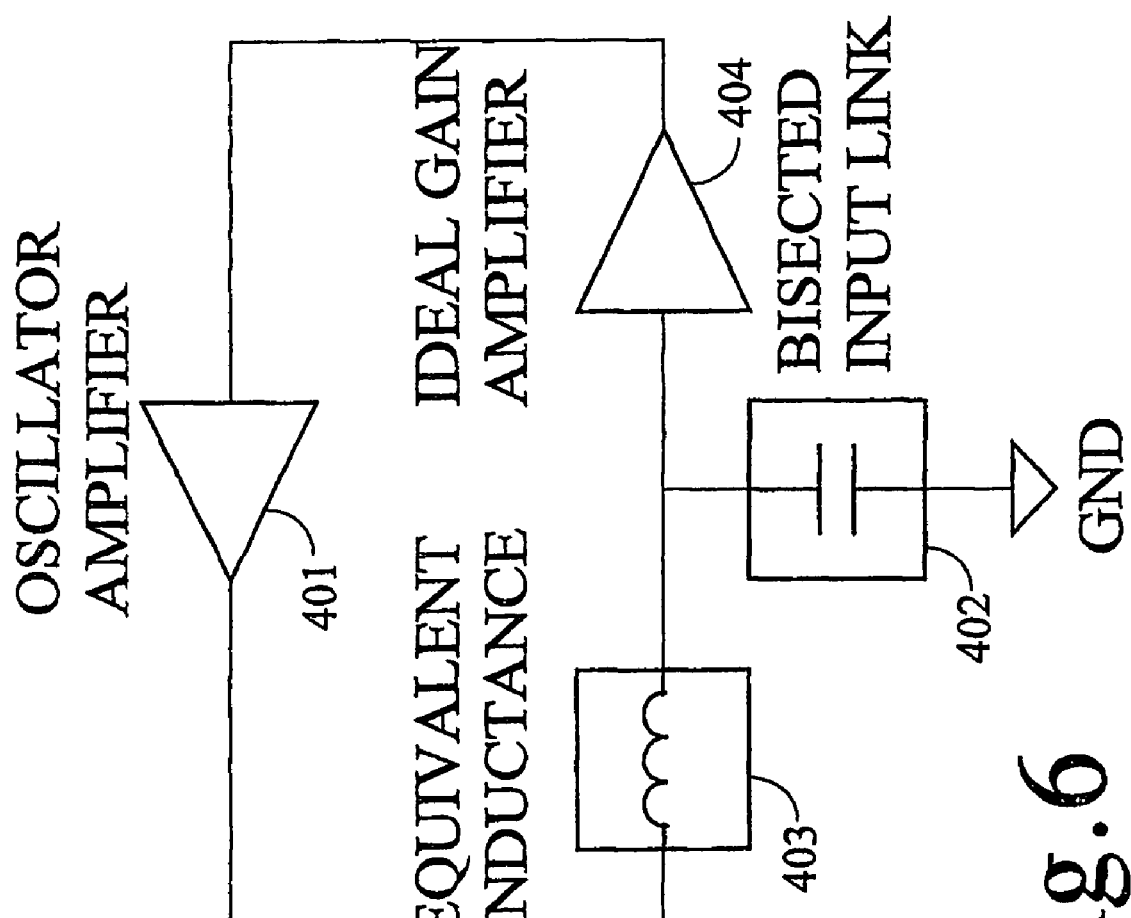
FIG. 6 is an ideal equivalent bisected model of the oscillator of FIG. 5 illustrating the desired operation during differential mode excitation.

Advantageously, although not absolutely necessary, each feedback amplifier is provided with its own internal feedback loop 307A/307B for allowing a second or higher-order frequency response for the phase shift function. By introducing a properly configured internal feedback loop, it is possible to configure the feedback amplifier and embedded phase shift filter so that the integral combination thereof together with the common link will have the same phase shifting properties as an LC-filter without the use of low-quality inductive elements. In practice, it is convenient to use an inverting feedback amplifier and introduce an appropriate degree of phase shift in the embedded phase shift filter. The desired operation during differential mode excitation is schematically illustrated in FIG. 6, which is an ideal equivalent bisected model of the oscillator of FIG. 5 when the feedback amplifiers are provided with internal feedback loops. In essence, according to the bisection theorem, the equivalent model of FIG. 6 illustrates one half of the overall oscillator with a bisected common capacitive link. The local feedback path from output to input of the oscillator amplifier 401 is represented by an equivalent inductance 403 and an ideal gain amplifier 404 for providing the necessary voltage transformation. The equivalent inductance 403 (L) cooperates with the bisected capacitive link 402 (C), thus fulfilling Barkhaussen's criteria of zero total phase shift (and unity loop gain) for the overall oscillator circuit.

Different realizations of the general principles outlined above in connection with FIGS. 5–6 will now be described in more detail with reference to circuit diagrams and equivalent models of relevant parts of the circuits.

Figure 7:
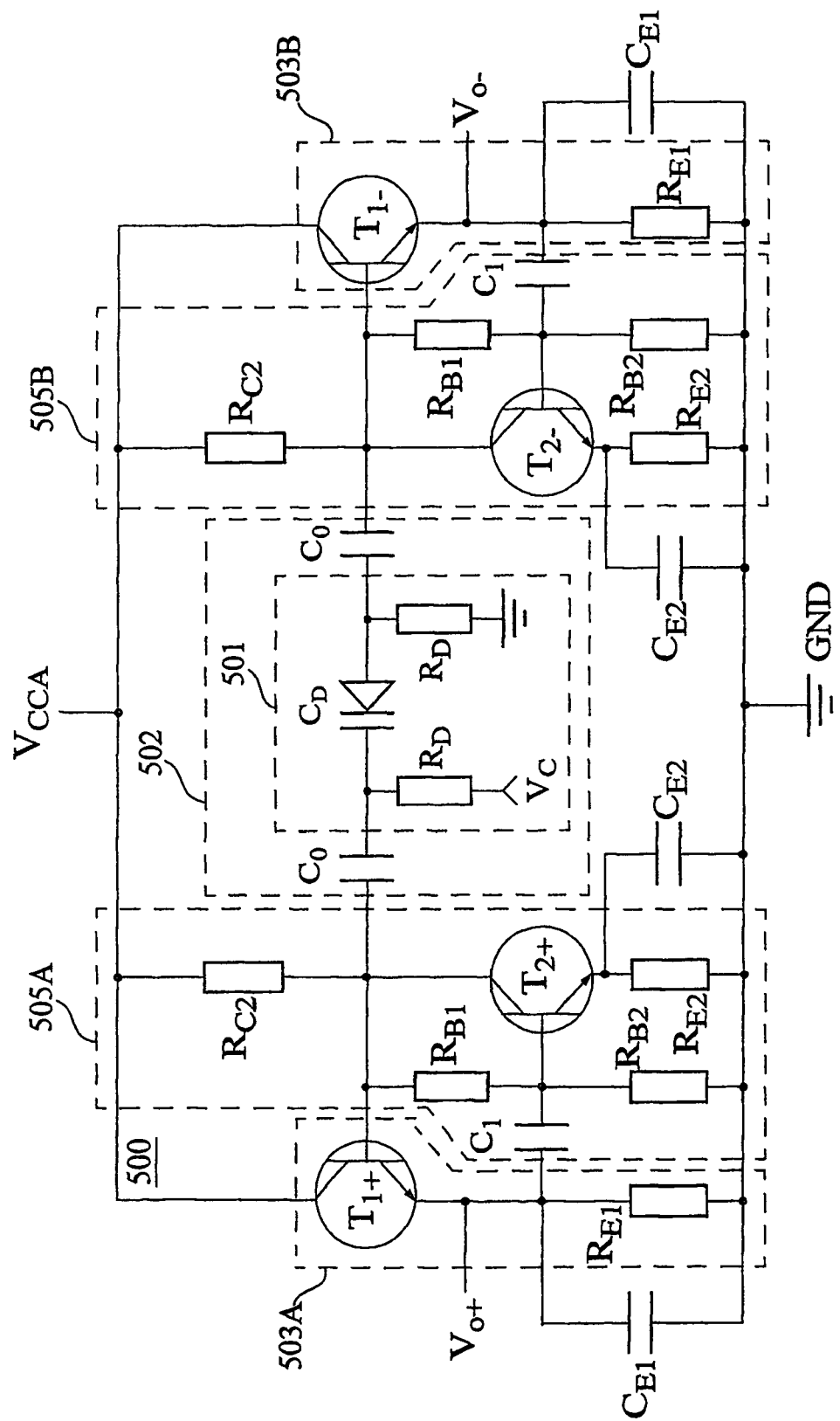
FIG. 7 is a circuit diagram of a differential oscillator according to a third embodiment of the invention.

FIG. 7 is a circuit diagram of a differential oscillator according to a third embodiment of the invention. The differential oscillator 500 comprises two branches interconnected by a common capacitive link 502. In this realization, each of the local feedback paths associated with the emitter-follower based oscillator amplifiers 503A and 503B is made up of an inverting feedback amplifier 505A/505B with an embedded capacitive phase shift filter. Preferably, the phase shift function in the feedback loop is generally based on an ideal inverting feedback amplifier together with the phase shift filter capacitor $C_1$. In addition, by introducing an emitter-decoupling capacitor $C_{E1}$ for each emitter-follower based oscillator amplifier 503A/503B, the oscillator amplifier will also act as an integrator in the local feedback path. In practice, the emitter-decoupling capacitor $C_{E1}$ forms an additional capacitive phase shifting element in the local feedback path. The resistance $R_{C2}$ has a biasing effect at the same time as it sets the gain of the inverting amplifier. The resistance $R_{B1}$ is used as the internal feedback element of the inverting amplifier.

The differential oscillator 500 may be realized with and without tuning. In this example, varactor-based tuning is shown as a default mechanism. Alternatively, however, the inverting amplifier stages may have a common emitter bias circuit in the form of a tunable current source (not shown). In this case, the tuning is basically effectuated by changing the offset current of the current source.

Although not explicitly shown in FIG. 7, the oscillator may also include circuitry for crystal or SAW oscillation enhancement. Also, as described above in connection with FIG. 2 and FIG. 4, the oscillator amplifier stages may have a common constant current source.

In order to complete the circuit design for any specific application or IC process, it is recommended to perform extensive simulations such as SPICE simulations together with extraction of parasitics from the actual layout. In the design work, frequency properties of the local feedback path is best studied under open loop conditions, i.e. with the oscillator amplifier disconnected from the local feedback path.

Figure 8:
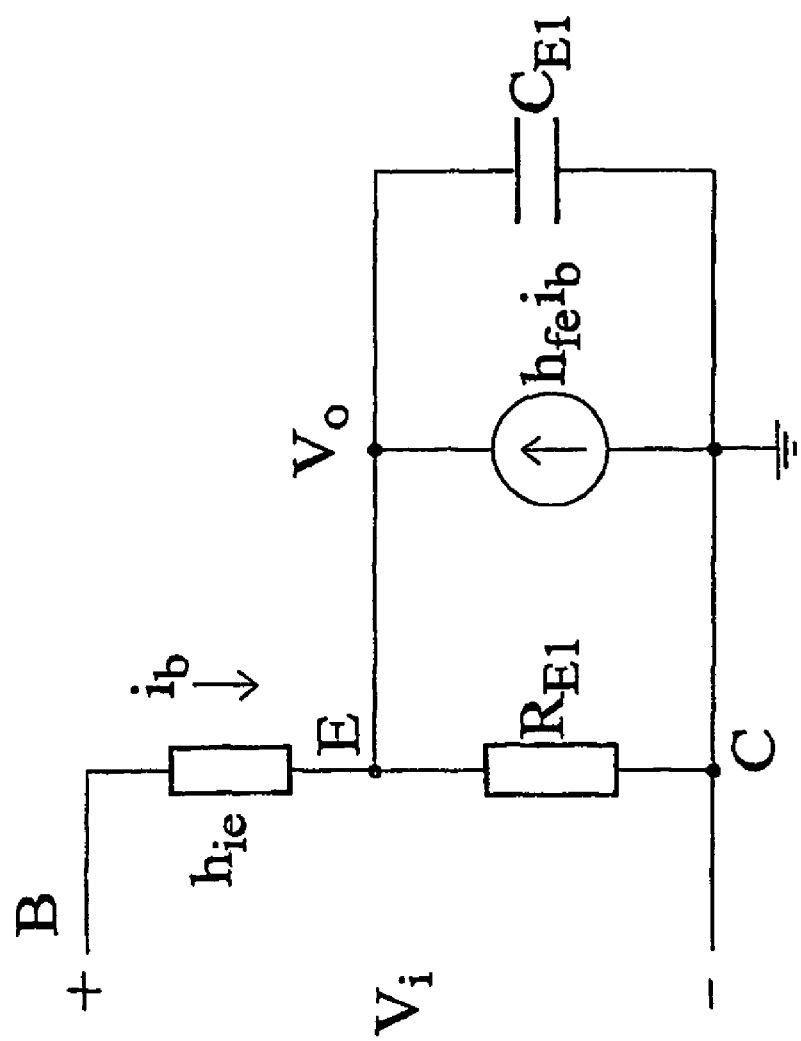
FIG. 8 is a schematic mid-frequency small signal AC electrical equivalent model of the emitter-follower based integrator/oscillator amplifier of FIG. 7.

FIG. 8 is a schematic mid-frequency small signal AC electrical equivalent model of the emitter-follower based integrator/oscillator amplifier of FIG. 7. The emitter-follower is capacitively loaded with the capacitor $C_{E1}$ to form a phase shifting integrator. Referring to FIG. 8, the base current $i_b$ is equal to:

$$i_b = \frac{V_i - V_o}{h_{ie}} \quad (1)$$

Applying Kirchoff's current summation law at the emitter node (E):

$$i_b + h_{fe} \cdot i_b = \frac{V_o}{R_{E1}} + \frac{V_o}{1/sC_{E1}} \quad (2)$$

where $h_{fe}$ is the small signal current gain, and the reactance is represented in the Laplace domain.

Using expression (1) in (2) gives:

$$\frac{V_i - V_o}{h_{ie}} \cdot (1 + h_{fe}) = \frac{V_o}{R_{E1}} \cdot (1 + sR_{E1}C_{E1}) \quad (3)$$

where $h_{ie}$ is the base-emitter impedance, and $(1+h_{fe}) \approx h_{fe}$.

The transfer function $F_i(s)$ which is defined as the ratio of $V_o$ and $V_i$ can then be expressed as:

$$F_i(s) = \frac{V_o}{V_i} = \frac{\frac{h_{fe}}{h_{ie}} \cdot \left[ R_{E1} \middle\| \left( \frac{h_{ie}}{h_{fe}} \right) \right]}{1 + s\left( R_{E1} \middle\| \left( \frac{h_{ie}}{h_{fe}} \right) \right) C_{E1}} = \frac{D_E}{1 + s\tau_E} \quad (4)$$

where $D_E$ is the amplifier buffer damping and $\tau_E$ is the low-pass filter time constant. In the frequency domain $s=j\omega$. Accordingly:

$$F_i(\omega) = \frac{D_E}{1 + j\omega\tau_E} \quad (5)$$

The phase shift $\phi$ from input to output, i.e. the "phase retard", is equal to:

$$\phi_i = \arg[F_i(j\omega)] = -\arctan[\omega\tau_E] = -\arctan\left[\frac{\omega}{\omega_E}\right] \quad (6)$$

with corner frequency:

$$f_E = \frac{\omega_E}{2\pi} = \frac{1}{2\pi\left[ R_{E1} \middle\| \frac{h_{ie}}{h_{fe}} \right] C_{E1}} \quad (7)$$

It can thus be seen that it is possible to obtain a phase shift between 0° and −90° depending on the combination of emitter-decoupling resistor ($R_{E1}$) and capacitor ($C_{E1}$). In the limiting case, the integrator gives an ideal phase shift of −90°.

Figure 9:
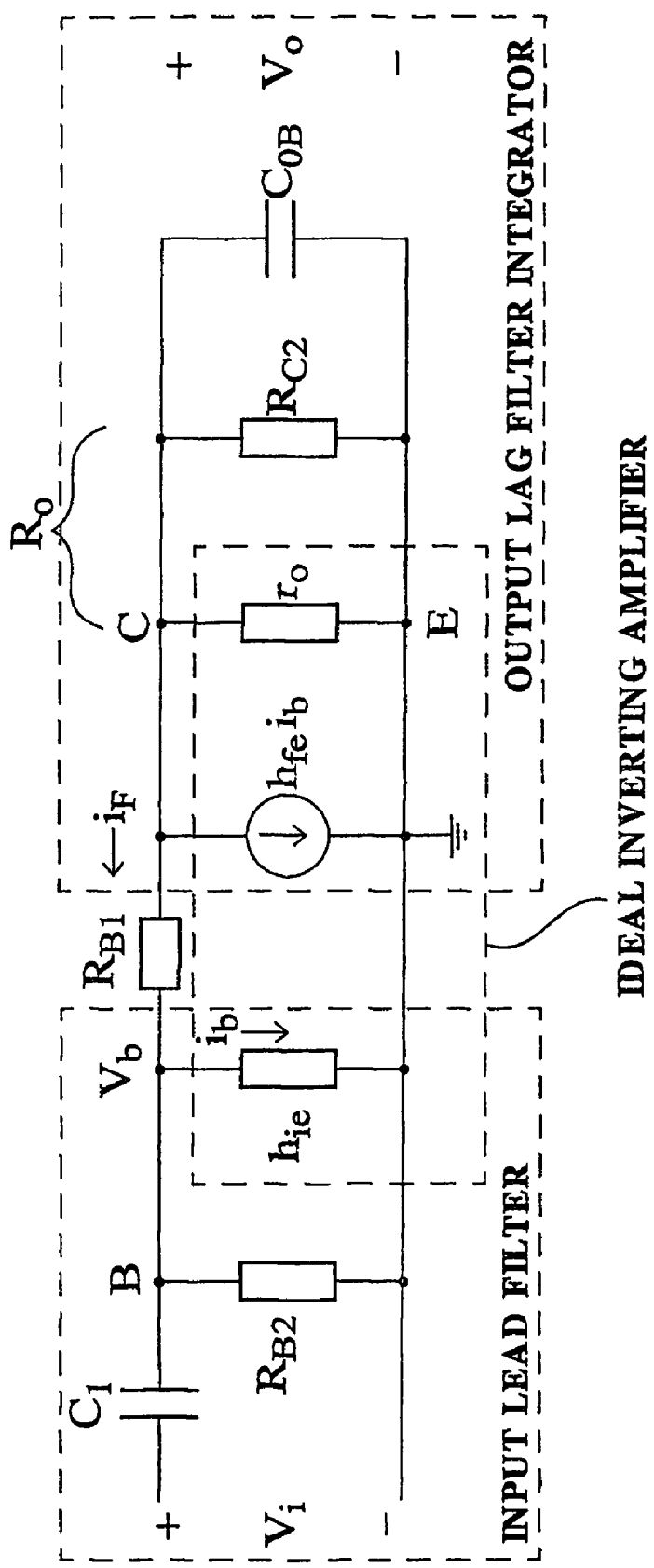
FIG. 9 is a schematic mid-frequency small signal AC electrical equivalent model of the inverting amplifier based feedback network of FIG. 7, including the bisected common capacitive link.

FIG. 9 is a schematic mid-frequency small signal AC electrical equivalent model of the inverting amplifier based feedback network of FIG. 7, including the bisected common capacitive link. In the equivalent model, the feedback network can be seen as formed around an ideal inverting amplifier with an input lead filter on one side and an output lag filter integrator on the other side, interconnected by an internal feedback resistor.

Applying Kirchoff's current summation law at the base node (B):

$$(V_i - V_b)sC_1 + i_F = \frac{V_b}{R_{B2}} + i_b \quad (8)$$

where $V_b$ is the base voltage potential. The base current $i_b$ is defined as:

$$i_b = \frac{V_b}{h_{ie}} \quad (9)$$

where $h_{ie}$ is the base-emitter impedance. The feedback current $i_F$ is given by:

$$i_F = \frac{V_o - V_b}{R_{B1}} \quad (10)$$

The expressions (8)–(10) give the following expression:

$$V_i sC_1 = -\frac{V_o}{R_{B1}} + V_b \cdot \left[ \frac{1}{R_{B2}} + \frac{1}{R_{B1}} + \frac{1}{h_{ie}} + sC_1 \right] \quad (11)$$

Applying Kirchoff's current summation law at the collector node (C):

$$i_F + h_{fe} \cdot i_b + \frac{V_o}{R_o} + sC_{0B} \cdot V_o = 0 \quad (12)$$

where $h_{fe}$ is the small signal current gain, $C_{0B}$ is the bisected capacitance from the common link and $R_o$ is the parallel combination of output loads (including the transistor output impedance $r_o$). Using expressions (9) and (10) in (12) gives:

$$\frac{V_o - V_b}{R_{B1}} + h_{fe} \cdot \frac{V_b}{h_{ie}} + \frac{V_o}{R_o} + sC_{0B} \cdot V_o = 0 \quad (13)$$

-continued $$\Rightarrow V_b = V_o \cdot \frac{\frac{1}{R_o} + \frac{1}{R_{B1}} + sC_{0B}}{-\frac{h_{fe}}{h_{ie}} + \frac{1}{R_{B1}}} \quad (14)$$

Now, using expression (14) in (11) gives the transfer function $F_{fA}(s)$ for the phase shift filter and feedback amplifier in combination with the bisected common capacitive link:

$$F_{fA}(s) = \frac{V_o}{V_i} = \frac{\left(-\frac{h_{fe}}{h_{ie}} + \frac{1}{R_{B1}}\right)sC_1}{-\frac{1}{R_{B1}}\left(-\frac{h_{fe}}{h_{ie}} + \frac{1}{R_{B1}}\right) + \left(\frac{1}{R_{B2}} + \frac{1}{R_{B1}} + \frac{1}{h_{ie}} + sC_1\right)\left(\frac{1}{R_o} + \frac{1}{R_{B1}} + sC_{0B}\right)} \quad (15)$$

Note that in order to provide sufficient voltage gain, the feedback must have high impedance:

$$R_{B1} \gg \frac{h_{ie}}{h_{fe}} \quad (16)$$

The transfer function $F_{fA}(\omega)$ in the frequency domain is given by:

$$F_{fA}(\omega) = \frac{V_o}{V_i} = \frac{\left(-\frac{h_{fe}}{h_{ie}} + \frac{1}{R_{B1}}\right)j\omega C_1}{-\frac{1}{R_{B1}}\left(-\frac{h_{fe}}{h_{ie}} + \frac{1}{R_{B1}}\right) + \left(\frac{1}{R_{B2}} + \frac{1}{R_{B1}} + \frac{1}{h_{ie}} + j\omega C_1\right)\left(\frac{1}{R_o} + \frac{1}{R_{B1}} + j\omega C_{0B}\right)} \quad (17)$$

The overall phase shift provided by the transfer function is defined by subtracting the phase shift of the denominator from the phase shift of the numerator. By analyzing expression (17) it can be seen that a phase shift of −90° is supplied by the numerator. The integrator formed by the capacitively decoupled oscillator buffer analyzed in connection with FIG. 8 introduces an additional phase shift of down to −90°. In a particular implementation, part of this phase shift may already be present due to parasitic phase shifts at high frequency. Properly dimensioned, the denominator contributes with the additional required phase shift of −180°. The term $$-\frac{1}{R_{B1}}\left(-\frac{h_{fe}}{h_{ie}} + \frac{1}{R_{B1}}\right)$$

is positive and is usually negligible. If $$\omega C_1 \gg \frac{1}{R_{B2}} + \frac{1}{R_{B1}} + \frac{1}{h_{ie}} \text{ and } \omega C_{0B} \gg \frac{1}{R_o} + \frac{1}{R_{B1}},$$

which corresponds to large capacitance values and/or a high operating frequency, the denominator reduces to (in the limiting case):

$$(j\omega C_{0B}) \cdot (j\omega C_1) = -\omega^2 C_{0B} C_1 \quad (18)$$

which is equivalent to a phase shift of −180°. In summary, it can be seen that $\arg[V_o]-\arg[V_i]$ varies between −180° and +90°. In the upper limiting case, $\arg[V_o]-\arg[V_i]=90°-(-180°)=+90°$, which is balanced out by the additional phase shift of −90° introduced by the capacitively decoupled buffer integrator analyzed in connection with FIG. 8. Thus, Barkhaussen's criterion of zero total phase shift is fulfilled. However, it should be understood that it is more practical to realize the required phase shift using more than one phase shifting integrator link in the overall feedback network, avoiding the limiting case, as will be described later on in connection with FIG. 12. It is apparent that it is easier to use several phase shifting links, each of which is optimized towards a target phase shift far away from the limiting case.

For the overall oscillator operation, it is of fundamental importance to utilize the common link in such a manner that a significant additional phase shift is provided only for differential signals and substantial common mode suppression is achieved. Another important objective is to operate the respective phase shift filters well apart from zero phase shift to reduce the probability of high or low frequency spurious oscillations. A significant phase shift well apart from zero will dominate over any parasitic phase shifts and the frequency-dependent phase shift of the wideband oscillator buffer amplifiers. In this way, the number of active elements in the circuit design can be minimized while at the same time maximizing the phase shift as a function of the frequency of the overall oscillator feedback network.

It should be understood that there are various types of phase shifting links that can be utilized and/or combined in the oscillator to fulfill Barkhaussen's criteria of sustainable oscillation. For example, both differentiating and integrating phase shifting links can be incorporated in the inverting amplifier and embedded phase shift filter. For general information on various phase shifting links in oscillators, reference is made to U.S. Pat. No. 4,571,558 and 4,646,033, which are incorporated herein by reference.

A fundamental property for excellent phase stability in high-performance oscillators is low phase noise, and therefore it is important to have a clear understanding of the underlying mechanisms that affect the phase noise characteristics in order to effectively reduce the phase noise. An efficient analysis of the phase noise can be performed based on the article "*A study of phase noise in CMOS oscillators*" by B. Razavi, IEEE Journal of Solid-State Circuits, Vol. 31, 1996, pp. 331–343 provided that the oscillator amplifier has a significantly wider bandwidth than the phase shift filter and that the amplitude response is more or less frequency independent due to heavy saturation. In this regard, the inventor has recognized that the phase noise is closely related to the frequency characteristics of the frequency selective feedback networks of the proposed oscillator. A sharp filter function in the feedback networks clearly gives a more narrow frequency output range and increased spectral purity. Under these circumstances, the phase shift $\phi_{fA}=\arg[F_{fA}(\omega)]$ through the filter varies abruptly when the frequency deviates from the nominal resonance value. This means that we have a large frequency derivative $$\frac{d\phi_{fA}}{d\omega}$$

of the phase shift function at the resonance frequency, which naturally translates into a corresponding large quality value $$Q = \frac{\omega_0}{2} \frac{d\phi_{fA}}{d\omega} \bigg|_{\omega=\omega_0}.$$

The performance characteristics of the proposed frequency selective feedback networks is analyzed by introducing a reference topology in form of a simple second order LC filter with known performance properties and comparing the two topologies. By using a known reference topology, it is possible to analyze the more complex feedback network topology according to the invention without explicit calculations by matching corresponding terms in the phase shift functions.

The reference topology is selected as second order LC filter configured as a voltage divider formed by a capacitive element C and an inductive element L with a loss resistance R.

The transfer function $F_{LC}(\omega)$ of the LC filter is given by:

$$F_{LC}(\omega) = \frac{1}{(1-\omega^2 LC) + j\omega RC} \equiv \frac{1}{(1-m_{LC}) + jn_{LC}} \quad (19)$$

It can be derived that the Q-value for the LC filter with the transfer function $F_{LC}(c)$ is given by:

$$Q_{LC} = \frac{\omega L}{R} = \frac{\omega^2 LC}{\omega RC} = \frac{m_{LC}}{n_{LC}} \quad (20)$$

Presenting the transfer function $F_{fA}(\omega)$ given in (17) in more compact form:

$$F_{fA}(\omega) = \frac{\left(-\frac{h_{fe}}{h_{ie}} + \frac{1}{R_{BI}}\right) j\omega C_1}{-\frac{1}{R_{BI}}\underbrace{\left(-\frac{h_{fe}}{h_{ie}} + \frac{1}{R_{BI}}\right)}_{k_1} + \left(\underbrace{\frac{1}{R_{B2}} + \frac{1}{R_{BI}} + \frac{1}{h_{ie}}}_{k_2} + \underbrace{j\omega C_1}_{jk_3}\right)\left(\underbrace{\frac{1}{R_o} + \frac{1}{R_{BI}}}_{k_4} + \underbrace{j\omega C_{0B}}_{jk_5}\right)} = \quad (21)$$

$$= \frac{jk_0}{k_1 + (k_2 + jk_3)(k_4 + jk_5)} = \frac{jk_0}{k_1 + k_2 k_4 - k_3 k_5 + j(k_2 k_5 + k_3 k_4)}$$

Bringing expression (21) into conformity with expression (19):

$$F_{fA}(\omega) = \frac{jk_0}{k_1 + k_2 k_4 - k_3 k_5 + j(k_2 k_5 + k_3 k_4)} \quad (22)$$

$$= \frac{\frac{jk_0}{jk_0}}{\frac{k_1 + k_2 k_4}{1 - \underbrace{\frac{k_3 k_5}{k_1 + k_2 k_4}}_{m_{fA}} + j\underbrace{\left(\frac{k_2 k_5 + k_3 k_4}{k_1 + k_2 k_4}\right)}_{n_{fA}}}}$$

$$= \frac{jn_0}{1 - m_{fA} + jn_{fA}}$$

By comparing the denominators of $F_{LC}(c)$ in (19) and $F_{fA}(\omega)$ in (22) and in analogy with expression (20) it can be seen that the Q-value of the frequency selective feedback network of the proposed oscillator can be estimated as:

$$Q_{fA} = \frac{m_{fA}}{n_{fA}} \quad (23)$$

From expressions (21) and (22) above it can be readily seen that the filter response is of second order:

$$m_{fA} \propto k_3 k_5 = \omega^2 C_1 C_{0B} \propto \omega^2 \quad (24)$$

Apparently, a higher-order filter can be achieved by arranging an internal feedback loop around the active element in the phase shift filter, without using inductive elements as in the LC filter topology. This is a great advantage, since a high Q-value can be obtained without being limited by the internal losses of the inductive element. Other significant improvements include reduced area and IC process requirements, reduced magnetic coupling due to absence of an explicit resonator, and possibility to increase the operating frequency.

Although the transistors used in the above embodiments have been described and shown as bipolar transistors, it should be understood that other types of transistors, such as field effect transistors (FETs), can be used for realizing differential oscillators according to the invention. In the case of a FET transistor, the gate, source and drain of the FET generally correspond to the base, emitter and collector of the bipolar transistor. In the following, an example of a very compact and cost-effective realization using FET transistors will be described with reference to FIG. 10.

Figure 10:
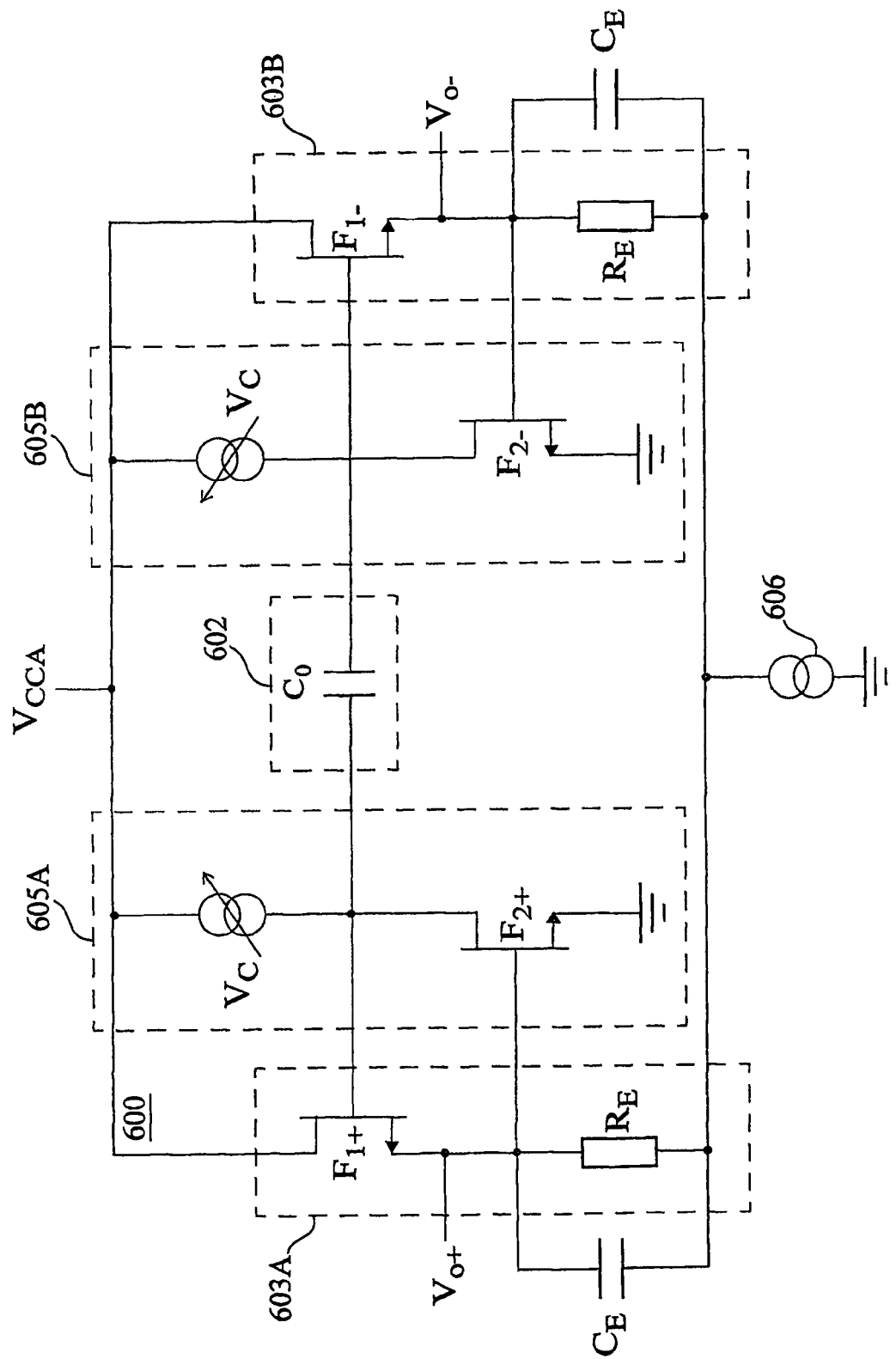
FIG. 10 is a schematic circuit diagram of a Field Effect Transistor (FET) based oscillator implementation utilizing integrator coupled inverting amplifiers and oscillator buffers according to a fourth embodiment of the invention.

FIG. 10 is a schematic circuit diagram of a FET-based oscillator implementation utilizing integrator coupled inverting amplifiers and oscillator buffers according to a fourth embodiment of the invention. The oscillator 600 basically comprises two branches interconnected by a common capacitive link 602. In this realization, each branch includes a source-follower based oscillator amplifier 603A/

603B in an integrator configuration with a decoupling capacitor $C_B$, and a common-source amplifier 605A/605B with an active drain load in the local feedback path. Instead of having the usual drain resistance ($R_D$) in the common-source amplifier configuration, an active drain load in the form of a tunable current source (tuned by $V_C$) is used for enabling tuning. The oscillator is also provided with bias point stabilization for the source-follower based oscillator amplifiers by means of a constant current source 606. The amplifiers are all based on FET transistors ($F_{1+}$, $F_{1-}$, $F_{2+}$, $F_{2-}$).

Figure 11:
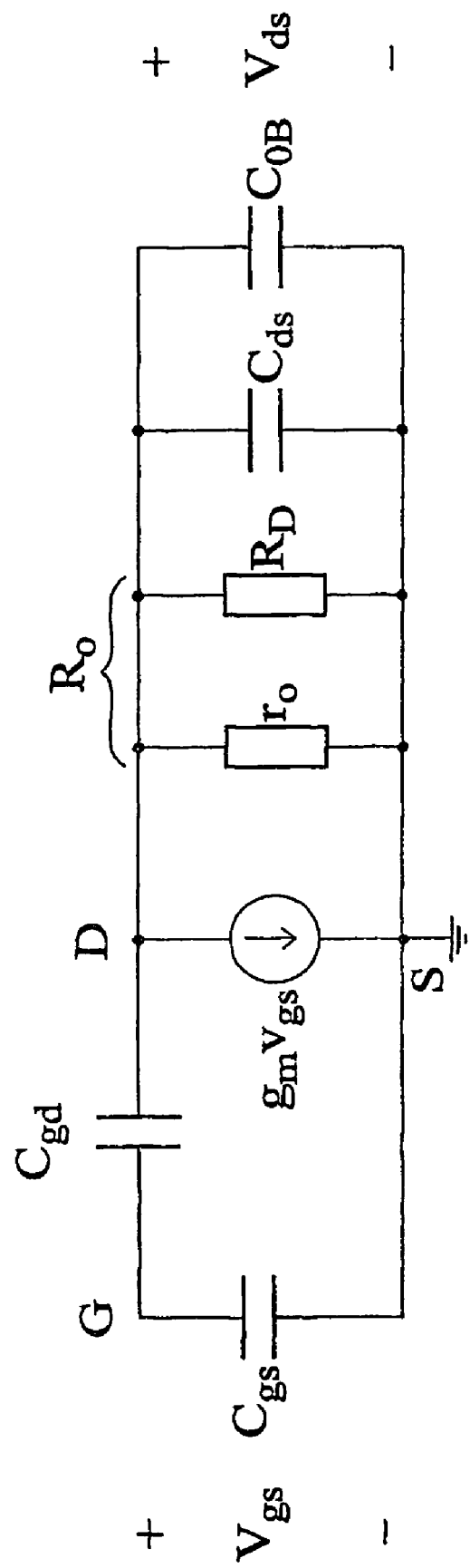
FIG. 11 is a schematic mid-frequency small signal AC electrical equivalent model of the common-source amplifier with active drain load of FIG. 10, including the bisected common capacitive link.

FIG. 11 is a schematic small signal AC electrical equivalent model of the actively loaded common-source amplifier of FIG. 10, including the bisected common capacitive link. It should first be noted that the bulk is grounded. If the driving impedance is not negligible, the gate-source capacitance will form an additional phase lag link. This is however handled by adjusting the source-follower decoupling capacitor.

Applying Kirchoff's current summation law at the drain node (D):

$$g_m V_{gs} + \frac{V_{ds}}{R_0} + V_{ds} \cdot sC_{ds} + (V_{ds} - V_{gs})sC_{gd} = 0 \quad (25)$$

This gives the transfer function $F_f(\omega)$:

$$F_f(\omega) = \frac{V_{ds}}{V_{gs}} = \frac{-g_m + j\omega C_{gd}}{\frac{1}{R_0} + j\omega(C_{ds} + C_{gd})} \quad (26)$$

where $V_{gs}$ is the gate-source voltage, $V_{ds}$ is the drain-source voltage, $g_m$ is the transistor transconductance, $C_{gd}$ is the gate-drain capacitance, $C_{ds}$ is the drain-source capacitance and $R_o$ is the parallel combination of output loads (including the transistor output impedance $r_o$ and the active drain load $R_D$). In expressions (25) and (26) above, it is assumed that the bisected common link capacitance $C_{OB}$ is included in the drain-source capacitance $C_{ds}$.

Lower Frequency Gain:

$$\left. \begin{array}{c} \omega \to 0 \\ s \to 0 \end{array} \right\} \Rightarrow \frac{V_{ds}}{V_{gs}} = -g_m R_0 \quad (27)$$

High Frequency Feedthrough:

$$s \to \infty \Rightarrow \frac{V_{ds}}{V_{gs}} \to \frac{C_{gd}}{C_{gd} + C_{ds}} < 1 \quad (28)$$

Zero Voltage Gain:

$$g_m = (2\pi f)^2 \cdot R_0 C_{gd}(C_{ds} + C_{gd}) \quad (29)$$

For a large drain-source capacitance value including the bisected common link capacitance $C_{OB}$, the transfer function $F_f(\omega)$ is given by:

$$F_f(\omega) = \quad (30)$$

$$\frac{V_{ds}}{V_{gs}} = \frac{-\frac{a_0}{g_m} + \frac{b_0}{j\omega C_{gd}}}{\underbrace{\frac{1}{r_0}}_{a_1} + \underbrace{j\omega(C_{ds} + C_{gd})}_{b_1}} = \frac{-a_0 + jb_0}{a_1 + jb_1} \approx (a_0 \gg b_0, b_1 \gg a_1) \approx$$

$$\frac{-a_0}{a_1 + jb_1} = \frac{-a}{1 + jb} = \frac{-a(1 - jb)}{1 + b^2} = \frac{-a + jab}{1 + b^2}$$

The corresponding phase shift is defined as:

$$\arg[F_f(\omega)] = 180° - \underbrace{\arctan[b]}_{\leq 90°} \quad (31)$$

In the limiting case, this corresponds to a phase shift of +90°.

The additional phase shift from the oscillator amplifier buffer configured as an integrator with a source-decoupling capacitor ($C_{E1}$) is given, in similarity to expression (6) above, by $$\phi = -\arctan\left[\frac{\omega}{\omega_E}\right].$$

This is equivalent to a phase shift of down to −90°. The total phase shift is thus +90°−90°=0°, thus fulfilling Barkhaussen's criteria of zero total phase shift.

In effect, we have two integrators working in opposite directions and so quadrature signals are readily available. Many important applications such as mixing and phase rotation require both the in-phase signal and the quadrature signal.

As mentioned earlier, working close to the limiting case for realizing significant phase shifts is difficult and normally introduces excessive attenuation when using only a single phase shifting integrator link. A more convenient way to realize the required phase shift is to introduce multiple cascaded feedback amplifier and phase shift filter blocks, each of which contributes with a small phase shift increment. This increases the design flexibility and relaxes the gain and phase shift requirements on each phase shifting block. With such an arrangement, the mandatory phase shift condition is met without serious degradation of the saturated amplitude, thus increasing the signal-to-noise ratio, even when the effect of introducing the additional active elements are taken into account. In this respect, it its also advisable to use several common phase shifting links interconnecting corresponding terminals in the local feedback paths to improve the differentiality even further.

Figure 12:
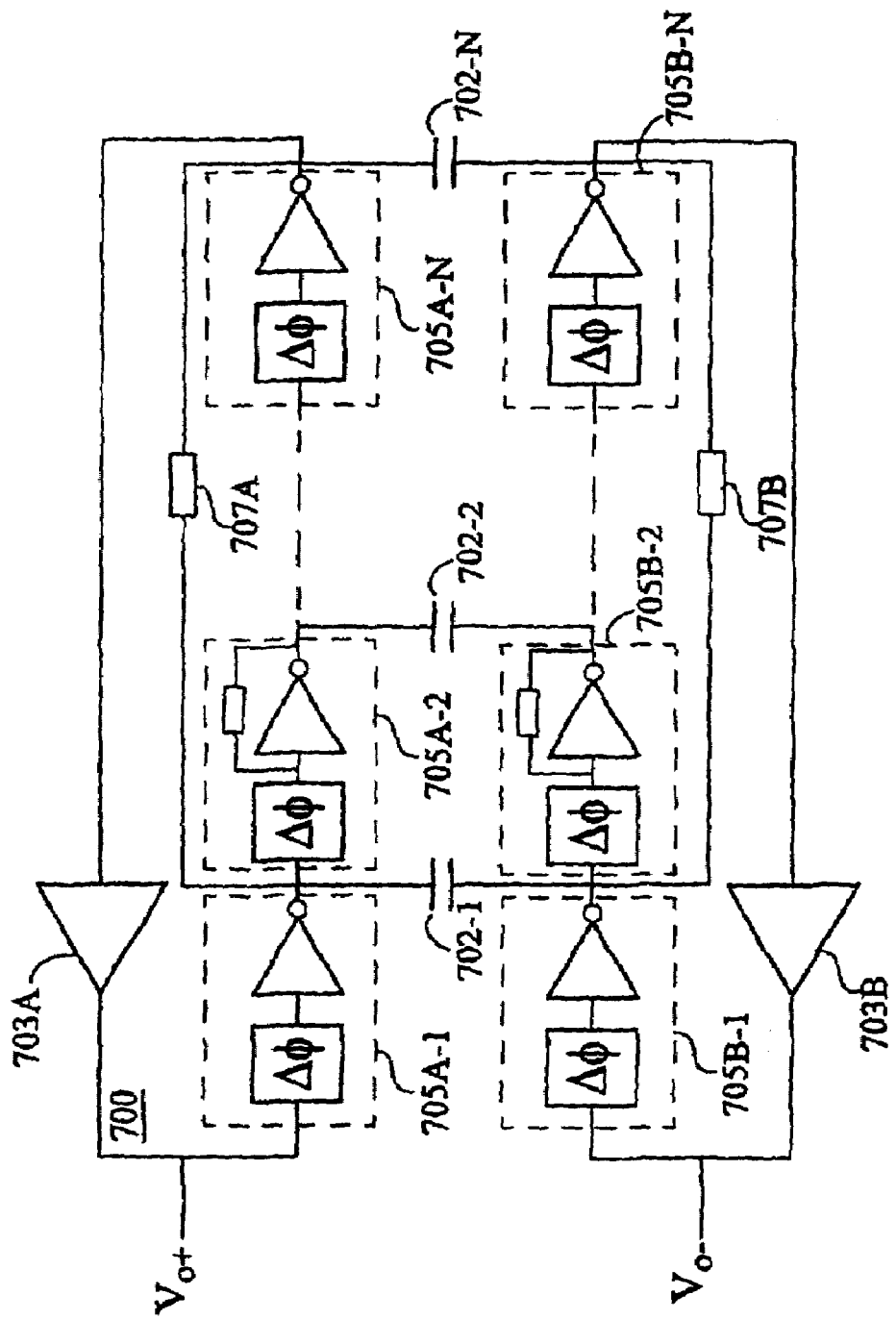
FIG. 12 is a schematic circuit diagram of a differential oscillator implementation incorporating multiple cascaded feedback amplifier and phase shift filter combinations.

FIG. 12 is a schematic circuit diagram of a differential oscillator implementation incorporating multiple cascaded feedback amplifier and phase shift filter combinations. In similarity to the embodiments described above, the oscillator 700 is based on oscillator amplifiers 703A, 703B having local feedback paths. In this implementation however, each feedback local path includes several phase shifting blocks 705A-1 to 705A-N/705B-1 to 705B-N. The phase shifting blocks may be based on inverting and non-inverting feedback amplifiers and phase shift filters in various combinations. In addition, the feedback amplifiers may be provided with their own internal feedback, and it is even possible to arrange feedback paths 707A/707B between different phase shifting blocks in the local feedback paths to enable higher-order phase shift filtering. In the case of using phase shifting blocks based on inverting amplifiers, it is recommendable to utilize an odd number of phase shifting blocks in each local feedback path to ensure negative feedback for low frequencies, thereby obtaining strong suppression of low-frequency spurious oscillations. This is similar to the properties of the cross-coupled feedback, but without the drawbacks of high-impedance loading. Furthermore, the local feedback systems are interconnected by several common phase shifting links 702-1 to 702-N. Each common phase shifting link provides a connection between points in the two local feedback systems that are in antiphase with respect to each other. In this way, symmetry is maintained and proper differential excitation of the common links is ensured. This gives a significant difference in loop phase shift when the two local feedback systems are working in antiphase, i.e. differential excitation, compared to the unwanted situation when both systems are working in phase, i.e. common mode excitation.

Returning to the realization of FIG. 10, it is apparent that each integrator formed by the respective common source amplifier 605A/605B together with the capacitive load provided by the bisected common link can be replaced by a number N of such cascaded units, thereby relaxing the gain requirements for each unit. In this case, each block is dimensioned to provide a phase shift equal to 360°/N at the oscillation frequency. It should also be noted that the decoupling capacitor $C_E$ is not utilized in this implementation, and that the oscillator amplifier does not provide any phase shift. The entire phase shift comes from the local feedback paths.

Although the invention is generally applicable, it should be pointed out that the invention is particularly suitable in high performance and high speed synchronous digital electronics systems and communication links with tight timing budgets and/or harsh spectral purity requirements for reference clocks, and for operation in noisy environments such as densely packed mixed analog and microprocessor/digital systems. In particular, transmitters and receivers used in wireless applications commonly employ a frequency multiplexed scheme where several independent analog or digital baseband signals are modulated on separate but closely spaced radio frequency carriers to form a set of channels. Extraction of the useful baseband data at the receiver side typically involves a down conversion mixer topology where the input RF signal is multiplied with a local oscillator clock signal. Because of the inherent spread spectrum tail output from a non-ideal oscillator with finite quality value, interfering signals from adjacent channels may also be down converted to the baseband. This will introduce noise or crosstalk, which ultimately will affect the bit error rate for the whole transmission link. In such applications, it is consequently of outmost importance to utilize high-performance oscillators such as those proposed by the invention.

The embodiments described above are merely given as examples, and it should be understood that the present invention is not limited thereto. For example, discrete resistors may be replaced by active loads. Improved rejection of power supply variation may be achieved through current source stabilization of the bias point. Current starved feedback amplifiers, which experience increased propagation delay, may be used for implementing phase shifts and/or for tuning the resonance frequency. Further modifications, changes and improvements which retain the basic underlying principles disclosed and claimed herein are within the scope and spirit of the invention.

The invention claimed is:

1. A differential oscillator having two branches, comprising:
   each of said branches includes an oscillator amplifier with a phase shifting and impedance transforming local feedback path from output to input of said oscillator amplifier to form a local feedback system; and
   said differential oscillator includes at least one common phase shifting link for interconnecting and cooperating with the local feedback systems to enable self-sustained differential oscillation, wherein each of said local feedback paths is implemented by active circuitry.

2. The differential oscillator according to claim 1, wherein, in differential mode operation, the electrical midpoint of said at least one common phase shifting link is virtually grounded and the local feedback systems of the two branches operate, in cooperation with said at least one common phase shifting link, in anti-phase with respect to each other.

3. The differential oscillator according to claim 1, wherein said at least one common phase shifting link is a non-feedback interconnection between the local feedback systems.

4. The differential oscillator according to claim 3 wherein said at least one common phase shifting link is connected between the inputs of said oscillator amplifiers.

5. The differential oscillator according to claim 4 wherein said common link and said local feedback paths are reactive.

6. The differential oscillator according to claim 5 wherein said common link is inductive and each of said local feedback paths is capacitive.

7. The differential oscillator according to claim 6 wherein each oscillator amplifier is a low-impedance buffer amplifier.

8. The differential oscillator according to claim 7, wherein said low-impedance buffer amplifier is based on a transistor configured as an emitter-follower or source-follower.

9. The differential oscillator according to claim 1, wherein each of said active local feedback paths includes a feedback amplifier and a phase shift filter.

10. The differential oscillator according to claim 9, wherein each of said active local feedback paths includes active circuitry forming said feedback amplifier with an embedded phase shift filter.

11. The differential oscillator according to claim 10, wherein an internal amplifier-feedback path is arranged within each of said local feedback paths to enable higher-order phase shift filtering.

12. The differential oscillator according to claim 11, wherein said feedback amplifier is an inverting amplifier.

13. The differential oscillator according to claim 12 wherein each of said active local feedback paths includes multiple cascaded feedback amplifier and phase shift filter combinations.

14. The differential oscillator according to claim 13 wherein said common link is reactive.

15. The differential oscillator according to claim 14, wherein said common link is capacitive.

16. The differential oscillator according to claim 15 wherein each oscillator amplifier is a low-impedance buffer amplfiier.

17. The differential oscillator according to claim 16, wherein said low-impedance oscillator amplifier is based on a transistor configured as an emitter-follower or source-follower.

18. The differential oscillator according to claim 17 wherein each oscillator amplifier is a current amplifier with a low-impedance output and a high-impedance input, and each local feedback path includes an inverting amplifier and a phase shifting filter arranged between the low-impedance input and the high-impedance output of said current amplifier.

19. The differential oscillator according to claim 18 wherein said common link comprises a reactive element connected in series with a crystal or surface acoustic wave device between the inputs of said oscillator amplifiers.

* * * * *